(12) United States Patent
Choi

(10) Patent No.: US 9,012,271 B2
(45) Date of Patent: Apr. 21, 2015

(54) THIN FILM TRANSISTOR ARRAY SUBSTRATE AND METHOD OF MANUFACTURING THE SAME

(71) Applicant: LG Display Co., Ltd., Seoul (KR)

(72) Inventor: Young-Seok Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/938,642

(22) Filed: Jul. 10, 2013

(65) Prior Publication Data
US 2014/0175467 A1    Jun. 26, 2014

(30) Foreign Application Priority Data
Dec. 21, 2012   (KR) .......................... 10-2012-0151125

(51) Int. Cl.
*H01L 21/00* (2006.01)
*H01L 27/12* (2006.01)

(52) U.S. Cl.
CPC ........ *H01L 27/1296* (2013.01); *H01L 27/1248* (2013.01)

(58) Field of Classification Search
CPC ...................... H01L 27/1214; H01L 29/66765
USPC .............. 438/99, 149; 257/E21.094, E21.104
See application file for complete search history.

(56) References Cited

U.S. PATENT DOCUMENTS 8,754,326 B2 *    6/2014   Doi et al. ...................... 136/256

\* cited by examiner

*Primary Examiner* — Quoc Hoang
(74) *Attorney, Agent, or Firm* — Fenwick & West LLP

(57) ABSTRACT

A method of manufacturing a substrate of a display device is disclosed. The method comprises forming a pixel electrode having a side edge that is under a patterned thermosetting insulating material layer. The method also comprises forming, from the patterned thermosetting insulating material, an insulating layer that covers the side edge of the pixel electrode by heat-treatment of the patterned thermosetting insulating material. As a result of the heat treatment of the patterned thermosetting insulating material, the patterned thermosetting insulating layer melts over the side edge of the pixel electrode.

9 Claims, 9 Drawing Sheets

THIN FILM TRANSISTOR ARRAY SUBSTRATE AND METHOD OF MANUFACTURING THE SAME

CROSS-REFERENCE TO RELATED APPLICATIONS

This application claims the benefit of Korean Patent Application No. 10-2012-0151125, filed on Dec. 21, 2012, which is hereby incorporated by reference as if fully set forth herein.

BACKGROUND

1. Field of the Invention

The present invention relates to a thin film transistor array substrate and a method of manufacturing the same, and more particularly, to a thin film transistor array substrate capable of improving reliability and a method of manufacturing the same.

2. Discussion of the Related Art

In recent years, the field of displays that visually express electric information signals has been rapidly developed with the advent of the information age. Correspondingly, a variety of flat display devices having excellent performance, such as slim design, light weight, and low power consumption, have been developed.

Examples of flat display devices may include liquid crystal display (LCD) devices, plasma display panels (PDPs), field emission display (FED) devices, electro luminescent display (ELD) devices, electro-wetting display (EWD) devices, and organic light emitting display (OLED) device. Such flat display devices essentially include a flat display panel for realizing an image. The flat display panel is configured such that a pair of substrates opposite to each other is bonded to each other while interposing a light emitting material or a polarizing material therebetween.

Generally, flat display devices of an active matrix driving mode include a thin film transistor array substrate to independently operate each of a plurality of pixel regions.

A thin film transistor array substrate includes a plurality of switch devices selectively turned on and off and formed to correspond to a plurality of pixel regions, a plurality of pixel electrodes formed to correspond to the plurality of pixel regions and connected to the plurality of switch devices, and a common electrode formed to correspond to the plurality of pixel regions. Here, each pixel region is independently driven. The thin film transistor array substrate may further include an interlayer insulating layer interposed between the pixel electrode and the common electrode to insulate the pixel electrode and the common electrode from each other.

Here, when the pixel electrode and the interlayer insulating layer are formed, the same mask may be used to simplify an exposure process using a mask. That is, a pixel electrode material layer and an insulating material layer are sequentially stacked. Then, a masking layer having an opening corresponding to each pixel region is disposed on the insulating material layer, and the insulating material layer is patterned using the masking layer to form the interlayer insulating layer. Then, while maintaining the masking layer on the interlayer insulating layer, the pixel electrode material layer is patterned to form the pixel electrode.

In this regard, the pixel electrode material layer is patterned by wet etching. According to this process, an undercut region is formed due to etch bias under the edge of the interlayer insulating layer exposed by wet etching with the pixel electrode material layer through the opening of the masking layer.

The undercut region may cause disconnection between the common electrode and the common line during formation of the common electrode.

In addition, since only the top surface of the pixel electrode is covered with the interlayer insulating layer, and the side of the pixel electrode is not covered with the interlayer insulating layer, the side of the pixel electrode may be connected to the common electrode during formation of the common electrode on the interlayer insulating layer, thereby causing short circuit.

Thus, reliability of the thin film transistor array substrate may be reduced.

SUMMARY

Accordingly, the present invention is directed to a thin film transistor array substrate and a method of manufacturing the same that substantially obviate one or more problems due to limitations and disadvantages of the related art.

An object of the present invention is to provide a thin film transistor array substrate capable of improving reliability by removing an undercut region formed at an interlayer insulating layer between a pixel electrode and a common electrode during formation of a pixel electrode and a method of manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In one embodiment, a method of manufacturing a substrate of a display device comprises forming a pixel electrode having a side edge that is under a patterned thermosetting insulating material layer. The method also comprises forming, from the patterned thermosetting insulating material, an insulating layer that covers the side edge of the pixel electrode by heat-treatment of the patterned thermosetting insulating material. As a result of the heat treatment of the patterned thermosetting insulating material, the patterned thermosetting insulating layer melts over the side edge of the pixel electrode.

In one embodiment, a substrate of a display device comprises a pixel electrode. The display device also comprises a thermosetting insulating layer formed over the pixel electrode. The thermosetting insulating layer covers a side edge of the pixel electrode that is under the thermosetting insulating layer.

In one embodiment, a method of manufacturing a thin film transistor array substrate includes forming a gate electrode on a substrate, forming a gate insulating layer over the substrate to cover the gate electrode, forming a common line on the gate insulating layer, forming at least one protective layer on the gate insulating layer to cover the common line and to expose at least one portion of the common line, forming a first pixel electrode layer over the gate insulating layer to cover the protective layer, forming color filters corresponding to each pixel region on the first pixel electrode layer, sequentially forming a second pixel electrode layer and a thermosetting insulating material layer over the first pixel electrode layer to cover the color filters, patterning the thermosetting insulating material layer by etching the thermosetting insulating material layer in a state that a mask having an opening corresponding to an edge of each pixel region is disposed on the thermosetting insulating material layer, forming a pixel electrode corresponding to each pixel region by patterning the first and second pixel electrode layers while maintaining the mask on the patterned thermosetting insulating material layer, forming an interlayer insulating layer contacting at least one portion of the protective layer to cover the side of the pixel electrode by removing the mask and heat-treating the patterned thermosetting insulating material layer, and forming a common electrode connected to an exposed portion of the common line and corresponding to each pixel region on the interlayer insulating layer.

In another aspect of the present invention, a thin film transistor array substrate includes a gate electrode formed on a substrate, a gate insulating layer formed over the substrate to cover the gate electrode, a common line formed on the gate insulating layer, at least one protective layer formed on the gate insulating layer to cover the common line and to expose at least one portion of the common line, a pixel electrode including a first pixel electrode layer formed on the gate insulating layer to cover at least one portion of the protective layer to correspond to each pixel region and a second pixel electrode layer formed on the first pixel electrode layer to contact at least one portion of the first pixel electrode layer formed on the protective layer, color filters interposed between the first pixel electrode layer and the second pixel electrode layer to correspond to each pixel region, an interlayer insulating layer formed on the second pixel electrode layer and contacting at least one portion of the protective layer to cover the side of the pixel electrode, and a common electrode formed on the interlayer insulating layer to correspond to each pixel region and having a contact hole penetrating the at least one protective layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

In the present disclosure, the terms on or over may be used interchangeably to describe the relationship between structures. When a structure is described as being on or over another structure, this includes situations where the structures contact each other as well as situations where an intervening structure is disposed therebetween. However, when the term "directly on" or "directly over" is used, it includes only situations where the structures contact each other.

Hereinafter, a thin film transistor array substrate and a method of manufacturing the same according to embodiments of the present invention will be described in detail.

First, referring to FIG. 1, a thin film transistor array substrate according to an embodiment of the present invention will be described.

Figure 1:
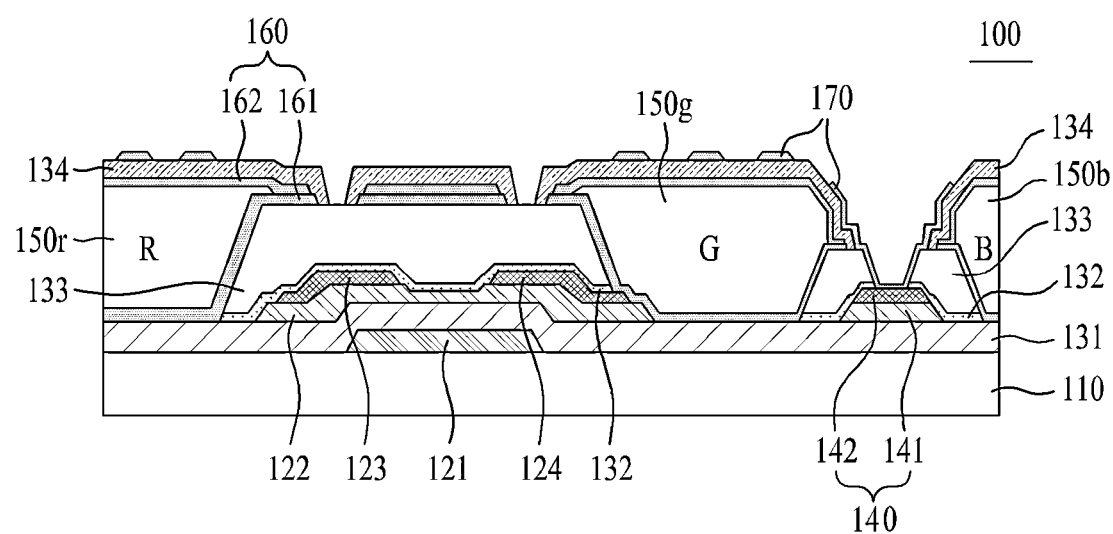
FIG. 1 is a cross-sectional view illustrating a thin film transistor array substrate according to an embodiment of the present invention.

FIG. 1 is a cross-sectional view illustrating a thin film transistor array substrate 100 according to an embodiment of the present invention.

As illustrated in FIG. 1, the thin film transistor array substrate 100 includes a substrate 110, a gate electrode 121, an active layer 122, a source electrode 123, a drain electrode 124, a gate insulating layer 131, at least one protective layer 132 and 133, an interlayer insulating layer 134, a common line 140, color filters 150r, 150g, and 150b, a pixel electrode 160, and a common electrode 170.

The gate electrode 121 is formed on the substrate 110. Although not shown in FIG. 1 in detail, the gate electrode 121 may extend from a gate line (not shown) aligned in a direction on the substrate 110.

The gate insulating layer 131 is formed over the substrate 110 to cover the gate electrode 121.

The active layer 122 is formed on the gate insulating layer 131 to partially overlap at least a portion of the gate electrode 121. In this regard, the active layer 122 may be formed of a semiconductor material.

The source electrode 123 is formed on a portion of the active layer 122 to partially overlap the active layer 122. Although not shown in FIG. 1 in detail, the source electrode 123 may extend from a data line (not shown) aligned on the gate insulating layer 131 in a direction intersecting the gate line. In this regard, a plurality of pixel regions is defined by the alignments of the gate line and the data line intersecting each other.

The drain electrode 124 is formed on another portion of the active layer 122 to be spaced apart from the source electrode 123 and to partially overlap the other portion the active layer 122.

In this regard, the source/drain electrodes 123 and 124 may be formed of conductive metallic materials.

In addition, the gate electrode 121, the active layer 122, the source electrode 123, and the drain electrode 124 constitute a thin film transistor corresponding to each pixel region.

The common line 140 is formed on the gate insulating layer 131. The common line 140 carries a supply voltage to the common electrodes of the pixels. Although not shown in FIG. 1 in detail, the common line 140 may be aligned in a direction parallel with the gate line.

In addition, in order to reduce the number of mask used for an exposure process, the same mask used in formation of the active layer 122 and the source/drain electrodes 123 and 124 may be used during formation of the common line 140. In this regard, the common line 140 may have a multi layer structure including a first common line layer 141 formed using the same material as the active layer 122 and a second common line layer 142 formed using the same material as the source/drain electrodes 123 and 124.

The at least one protective layer 132 and 133 is formed on the gate insulating layer 131 to cover the active layer 122, the source electrode 123, the drain electrode 124, and the common line 140. The at least one protective layer 132 and 133 respectively have a pattern exposing at least one portion of the drain electrode 124 and at least one portion of the common line 140.

In this regard, the at least one protective layer 132 and 133 may include a first protective layer 132 formed on the gate insulating layer 131 using silicon nitride (SiNx) and a second protective layer 133 formed on first protective layer 132 using photoacryl and having a thickness greater than that of the first protective layer 132.

However, this is an example, and the at least one protective layer according to the present embodiment may have a single layer or multiple layers including different materials or having different thicknesses. However, hereinafter, as the at least one protective layer used herein, the first and second protective layers 132 and 133 will be described for convenience of description.

The pixel electrode 160 corresponds to each of the pixel regions and is connected to the drain electrode 124. The pixel electrode 160 includes a first pixel electrode layer 161 and a second pixel electrode layer 162.

The first pixel electrode layer 161 is formed on the gate insulating layer 131 to cover at least one portion of the second protective layer 133. Here, the first pixel electrode layer 161 contacts an exposed portion of the drain electrode 124 that is not covered with the protective layers 132 and 133, to be connected to the drain electrode 124.

In addition, the second pixel electrode layer 162 is formed on the first pixel electrode layer 161 to cover color filters 150r, 150g, and 150b, which will be described later. In this regard, the second pixel electrode layer 162 contacts at least one portion of the first pixel electrode layer 161 formed on the second protective layer 133.

Furthermore, the second pixel electrode layer 162 may be formed of a transparent conductive material such as Indium-tin-oxide (ITO). In the same manner, the first pixel electrode layer 161 may be formed of a transparent conductive material.

The color filters 150r, 150g, and 150b are disposed between the first pixel electrode layer 161 and the second pixel electrode layer 162 to correspond to each pixel region.

In this regard, the color filters 150r, 150g, and 150b of each pixel region may respectively be a region emitting red light 150r, a region emitting green light 150g, or a region emitting blue light 150r.

The interlayer insulating layer 134 is formed on the second pixel electrode layer 162. Particularly, the interlayer insulating layer 134 contacts at least one portion of the second protective layer 133 to cover side edges of the first and second pixel electrode layers 161 and 162 formed on the second protective layer 133 to contact each other. The result is that the pixel electrode 160 is fully enclosed on all side edges by the interlayer insulating layer 134.

Particularly, the interlayer insulating layer 134 is formed of a thermosetting insulating material that melts and becomes temporarily fluidic by a single heat treatment. For example, the thermostatic insulating material may be negative photoacryl.

That is, the interlayer insulating layer 134 is formed of a thermosetting insulating material that is formed over the second pixel electrode layer 162, patterned to correspond to each pixel region, and heat-treated after patterning the first and second pixel electrode layers 161 and 162.

Here, when the patterned thermosetting insulating material layer is heat-treated, the layer melts and becomes temporarily fluidic, so that the patterned thermosetting insulating material layer flows down into an undercut region formed under the edge of the layer and onto the second protective layer 133 during formation of the pixel electrode 160. As described above, through the heat treatment, the undercut region is filled and removed, and the interlayer insulating layer 134 that covers the side edges of the pixel electrode 160 and contacts at least one portion of the second protective layer 133 is formed. That is, the interlayer insulating layer 134 does not have an undercut region formed during formation of the pixel electrode 160.

The formation of the interlayer insulating layer 134 will be described in more detail below with reference to a manufacturing method thereof.

The common electrode 170 is formed on the interlayer insulating layer 134 to correspond to each pixel region and connected to an exposed portion of the common line 140 that is not covered with the first and second protective layers 132 and 133. Here, the common electrode 170 may be formed of a transparent conductive material.

In this regard, since the interlayer insulating layer 134 does not have an undercut region, disconnection between the common electrode 170 and the common line 140 caused by the undercut region may be prevented.

In addition, since not only the top surface of the pixel electrode 160 but also side surfaces of the pixel electrode 160 are covered with the interlayer insulating layer 134, short circuit between the pixel electrode 160 and the common electrode 170 may be prevented.

As described above, the interlayer insulating layer 134 formed through patterning of the thermosetting insulating material and heat treatment may improve reliability of the thin film transistor array substrate 100.

Hereinafter, a method of manufacturing a thin film transistor array substrate according to an embodiment of the present invention will be described with reference to FIGS. 2, 3A to 3K, 4A, 4B, 5A, and 5B.

Figure 2:
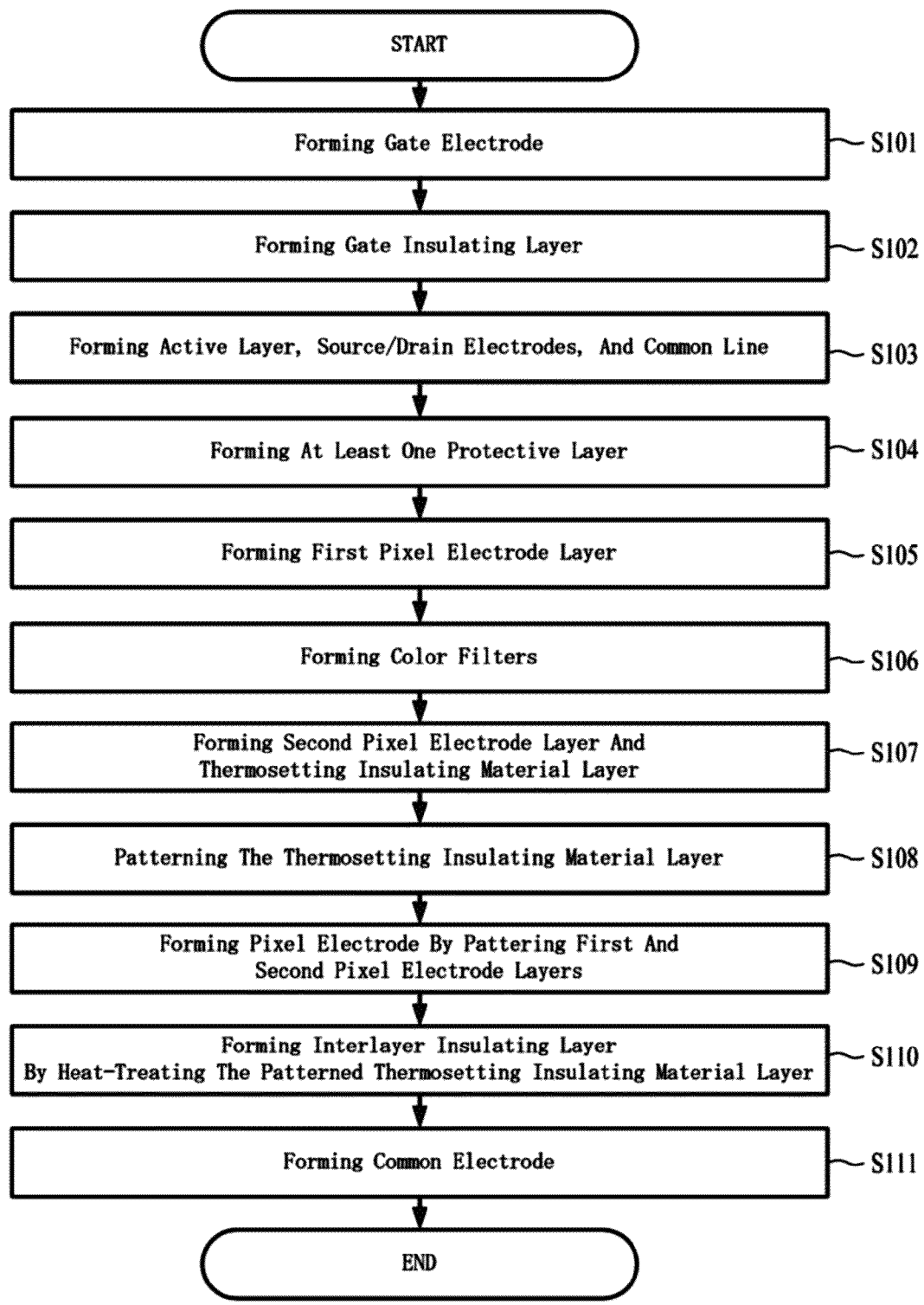
FIG. 2 is a flowchart illustrating a method of manufacturing a thin film transistor array substrate according to an embodiment of the present invention.
Figure 4A:
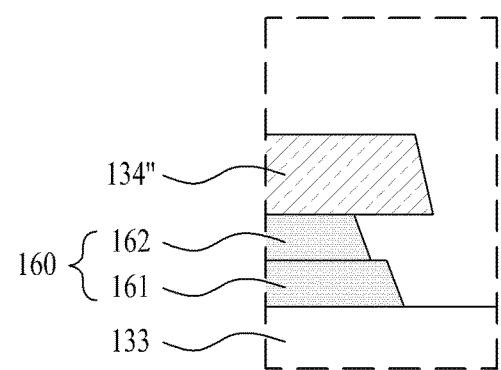
FIGS. 4A and 4B are an enlarged cross-sectional view of portion II of FIG. 3I and a scanning electron microscopic (SEM) image thereof.
Figure 4B:
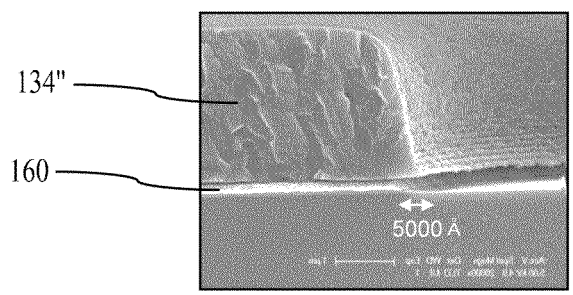
Figure 5A:
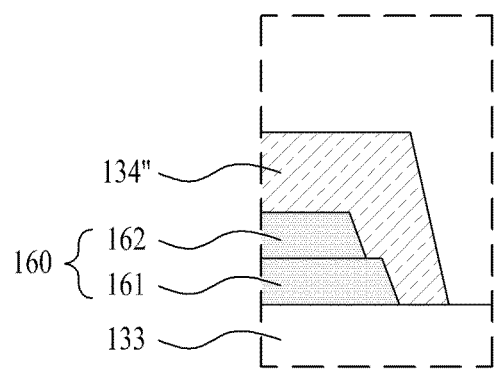
FIGS. 5A and 5B are an enlarged cross-sectional view of portion III of FIG. 3J and a SEM image thereof.
Figure 5B:
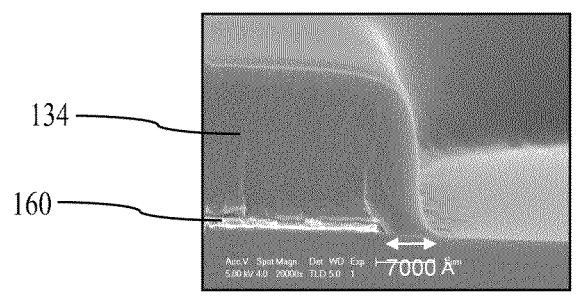

FIG. 2 is a flowchart illustrating a method of manufacturing a thin film transistor array substrate according to an embodiment of the present invention. FIGS. 3A to 3K are diagrams for describing each operation of FIG. 2. FIGS. 4A and 4B are an enlarged sectional view of portion II of FIG. 3I and a scanning electron microscopic (SEM) image thereof. FIGS. 5A and 5B are an enlarged sectional view of portion III of FIG. 3J and a SEM image thereof.

As illustrated in FIG. 2, the method of manufacturing a thin film transistor array substrate includes forming a gate electrode on a substrate (S101), forming a gate insulating layer over the substrate to cover the gate electrode (S102), forming an active layer, source/drain electrodes and a common line on the gate insulating layer (S103), forming at least one protective layer on the gate insulating layer to cover the active layer, the source/drain electrodes and the common line (S104), forming a first pixel electrode layer over the gate insulating layer to cover the protective layer (S105), forming color filters on the first pixel electrode layer to correspond to each pixel region (S106), sequentially forming a second pixel electrode layer and a thermosetting insulating material layer over the first pixel electrode layer to cover the color filters (S107), patterning the thermosetting insulating material layer by etching the thermosetting insulating material layer under the condition that a masking layer having an opening corresponding to an edge of each pixel region is disposed on the thermosetting insulating material layer (S108), forming a pixel electrode corresponding to each pixel region by patterning the first and second pixel electrode layers while maintaining the masking layer on the patterned thermosetting insulating material layer (S109), forming an interlayer insulating layer contacting at least one portion of the protective layer so as to cover sides of the pixel electrode by removing the masking layer disposed on the patterned thermosetting insulating material layer and heat-treating the patterned thermosetting insulating material layer (S110), and forming a common electrode on the interlayer insulating layer to be connected to the common line via a contact hole penetrating the at least one protective layer and corresponding to each pixel region (S111).

The method further includes forming a contact hole penetrating the at least one protective layer to expose at least one portion of the common line by etching the protective layer after the forming of the protective layer (S104) and before the forming of the first pixel electrode layer (S105).

Figure 3A:
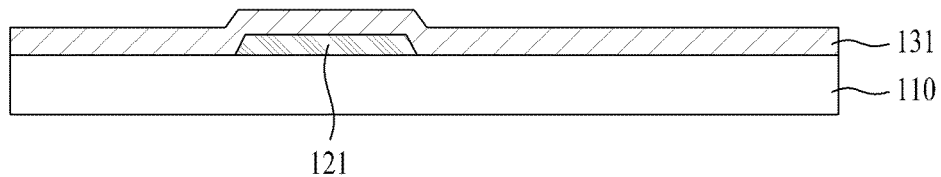
FIGS. 3A to 3K are diagrams for describing each operation of FIG. 2.

Particularly, as illustrated in FIG. 3A, the gate electrode 121 corresponding to each pixel region is formed by patterning a first metal layer laminated on the substrate 110 (S101). In addition, the gate insulating layer 131 is formed over the substrate 110 to cover the gate electrode 121 (S102). In this regard, the gate insulating layer 131 may be formed of a silicon nitride (SiNx)-based insulating material.

Figure 3B:
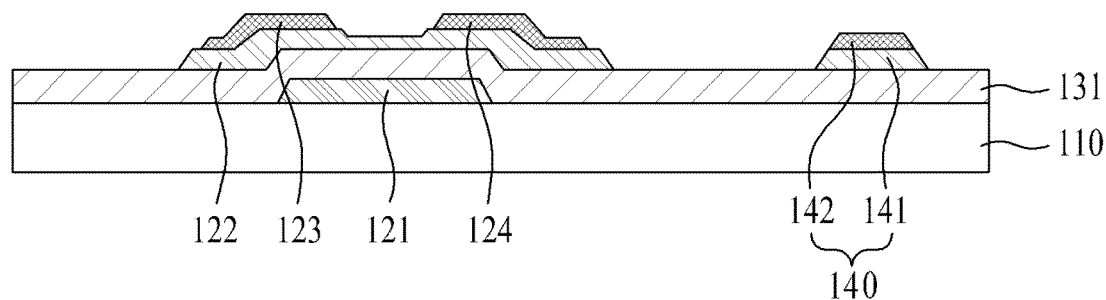

As illustrated in FIG. 3B, the active layer 122, the source electrode 123, the drain electrode 124, and the common line 140 are formed by differentially patterning semiconductor materials and a second metal layer sequentially laminated on the substrate 110 (S103).

In this regard, the common line 140 is formed by use of the same masks used to form the active layer 122, and the source/drain electrodes 123 and 124. Accordingly, the common line 140 has a multi layer structure including a first common line layer 141, which is formed of the same semiconductor material used to form the active layer 122, and a second common line layer 142, which is formed of the same material used to form the source/drain electrodes 123 and 124 as a metal layer.

Figure 3C:
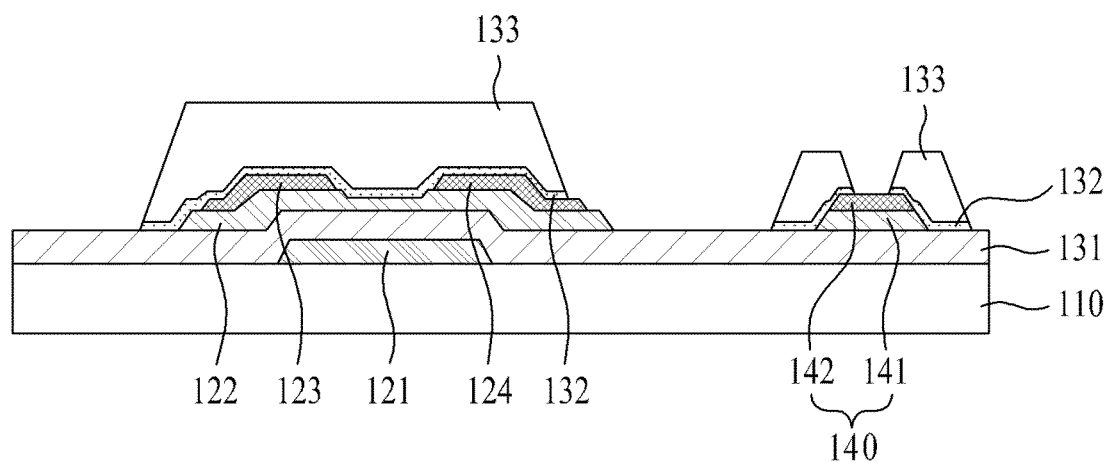

As illustrated in FIG. 3C, at least one protective layer 132 and 133 is formed on the gate insulating layer 131 to cover the active layer 122, the source electrode 123, the drain electrode 124, and the common line 140 such that at least one portion of each of the drain electrode 124 and the common line 140 is exposed (S104).

For example, the forming of the protective layer 132 and 133 (S104) may include forming a first insulating material layer on the gate insulating layer 131 using silicon nitride (SiNx), forming a second insulating material layer on the first insulating material layer using photoacryl, and forming island-shaped first and second protective layers 132 and 133 on the gate insulating layer 131 by patterning the first and second insulating material layers. Here, one of the island-shaped first and second protective layers 132 and 133 is formed to cover the active layer 122, the source electrode 123 and the drain electrode 124 and to exposes at least one portion of the drain electrode 124. Another of the island-shaped first and second protective layers 132 and 133 is formed to cover the common line 140 and to expose at least one portion of the common line 140.

In this regard, the at least one protective layer 132 and 133 includes a first protective layer 132 formed on the gate insulating layer 131 using silicon nitride and a second protective layer 133 formed on the first protective layer 133 using photoacryl.

However, this is an example, and the at least one protective layer may also have a single layer or multiple layers including different materials or having different thicknesses. Hereinafter, as the at least one protective layer used herein, the first and second protective layers 132 and 133 will be described for convenience description.

Figure 3D:
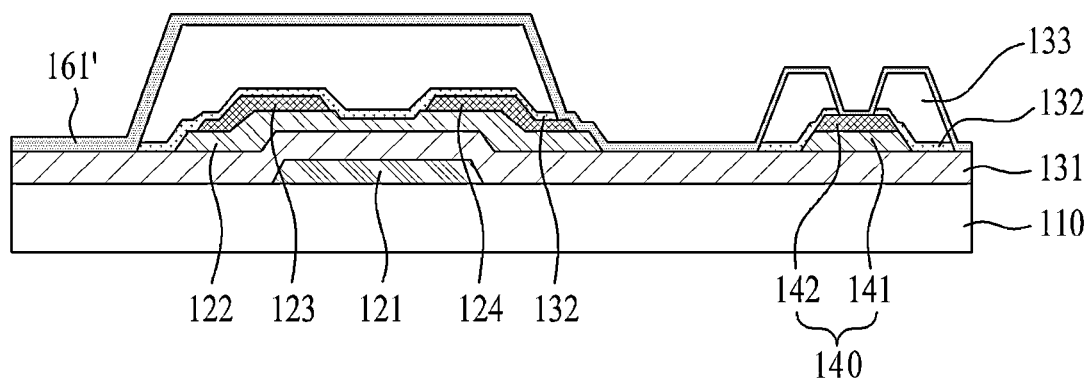

As illustrated in FIG. 3D, a first pixel electrode layer 161' is formed over the gate insulating layer 131 to cover the first and second protective layers 132 and 133 (S105). Here, the first pixel electrode layer 161' contacts an exposed portion of the drain electrode 124 that is not covered with the island-shaped first and second protective layers 132 and 133.

In addition, the first pixel electrode layer 161' may be formed of a transparent conductive material such as ITO.

Figure 3E:
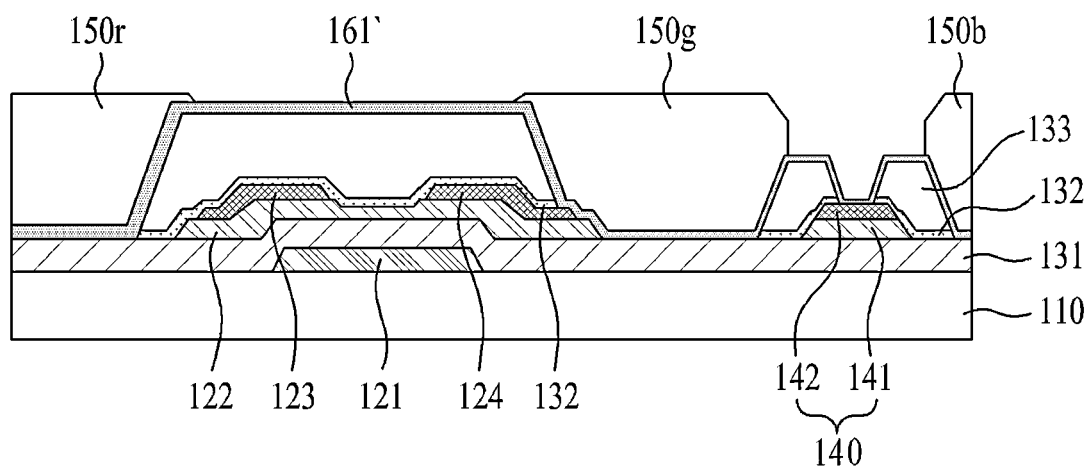

As illustrated in FIG. 3E, color filters 150r, 150g, and 150b corresponding to each pixel region are formed on the first pixel electrode layer 161' (S106). In this regard, the color filters 150r, 150g, and 150b of each pixel region may respectively be a region emitting red light 150r, a region emitting green light 150g, or a region emitting blue light 150r.

Figure 3F:
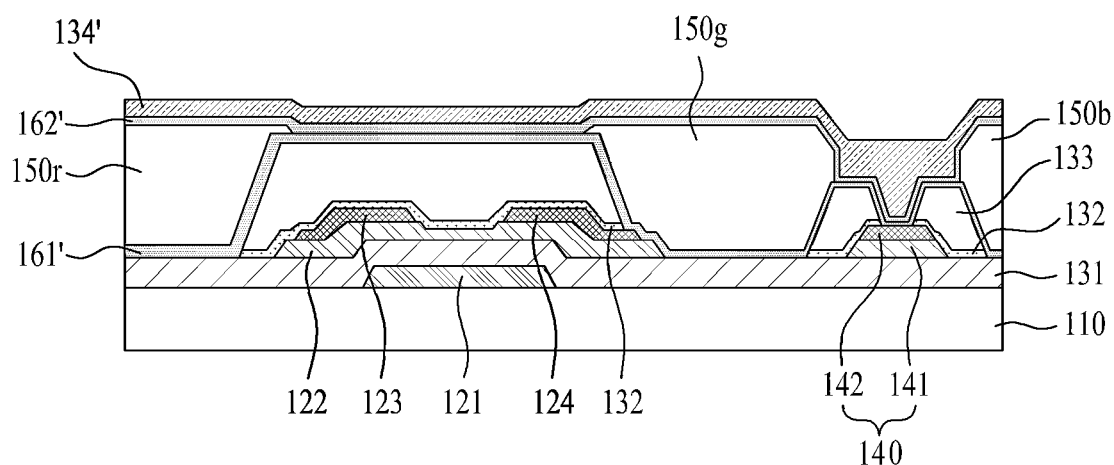

As illustrated in FIG. 3F, a second pixel electrode layer 162' is formed over the first pixel electrode layer 161' to cover the color filters 150r, 150g, and 150r, and then a thermosetting insulating material layer 134' are formed over the second pixel electrode layer 162' (S107).

Here, the thermosetting insulating material is a material that becomes temporarily fluidic by a single heat treatment process (curing process). For example, the thermosetting insulating material may be negative photoacryl.

Figure 3G:
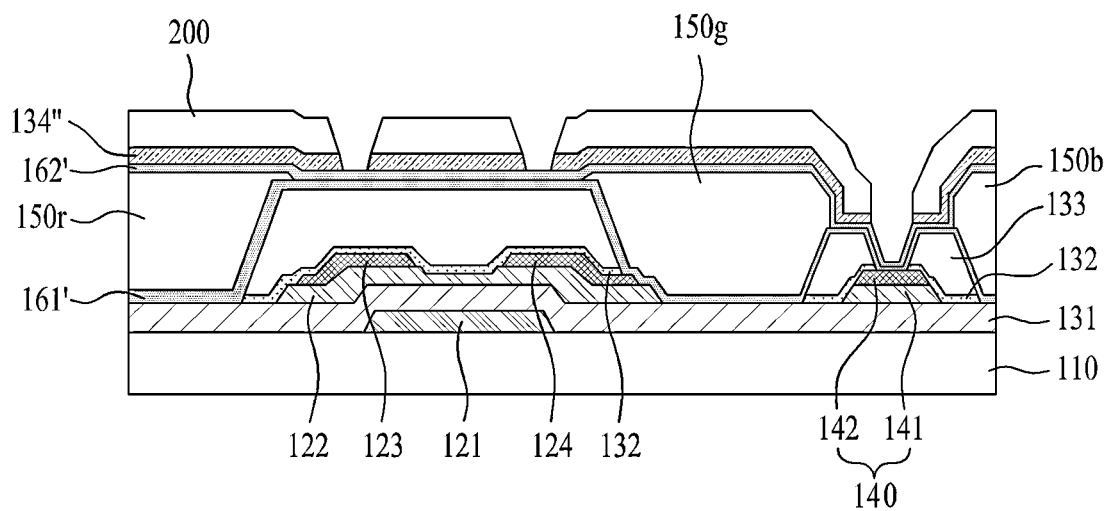

Then, as illustrated in FIG. 3G, the thermosetting insulating material layer 134' is patterned by etching the thermosetting insulating material layer 134' under the condition that a masking layer 200 (e.g., patterned photoresist) having an opening corresponding to an edge of each pixel region is disposed on the thermosetting insulating material layer 134' (S108). Here, the etching of the thermosetting insulating material layer 134' may be performed using dry etching.

Accordingly, a patterned thermosetting insulating material layer 134'' having a pattern corresponding to each pixel region is formed.

Figure 3H:
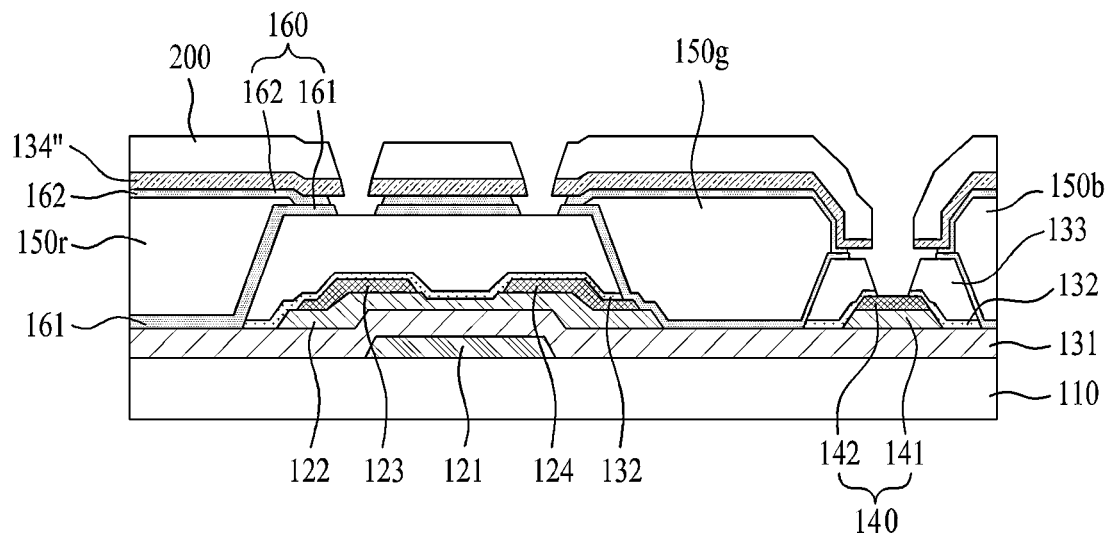

Then, as illustrated in FIG. 3H, the first and second pixel electrode layers 161 and 162 are patterned by etching the first and second pixel electrode layers 161 and 162 while maintaining the masking layer 200 on the patterned thermosetting insulating material layer 134'' (S109). In this regard, the etching of the first and second pixel electrode layers 161 and 162 may be performed by wet etching.

Accordingly, a pixel electrode 160 corresponding to each pixel region and including first and second pixel electrode layers 161 and 162 which are patterned on the second protective layer 133 to be connected to each other is formed.

Figure 3I:
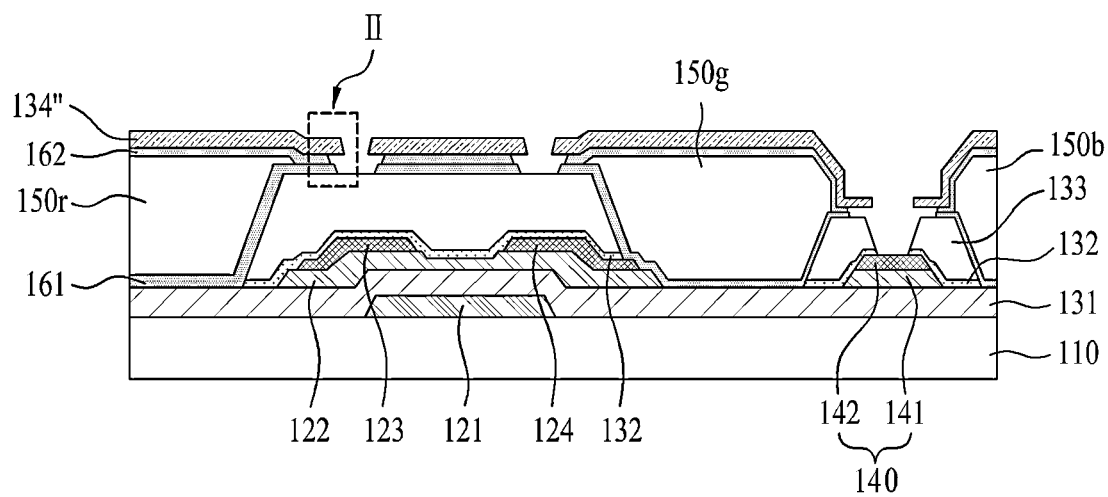

Then, as illustrated in FIG. 3I, the masking layer 200 of FIG. 3H disposed on the patterned thermosetting insulating material layer 134'' is removed.

Meanwhile, in the patterning of the first and second pixel electrode layers 161 and 162 (S109), an undercut region is formed under an edge of the patterned thermosetting insulating material layer 134'' due to etch bias associated with a wet etching process for the first and second pixel electrode layers 161 and 162.

That is, as shown in FIG. 4A, an undercut region is formed under the edge of the patterned thermosetting insulating material layer 134'' after wet etching of the first and second pixel electrode layers 161 and 162. In other words, since a portion of the edge of the patterned thermosetting insulating material layer 134'' becomes an undercut region under which the pixel electrode 160 is not formed due to etch bias associated with the wet etching process, the side of the patterned thermosetting insulating material layer 134'' cannot be continuously formed with the side of the second protective layer 133 disposed thereunder. As a result, a side edge of the pixel electrode underneath the patterned thermosetting insulating material layer 134'' is exposed and unprotected.

For example, as illustrated in FIG. 4B, the undercut region of the patterned thermosetting insulating material layer 134" may have a width of about 5000 Å.

The method of manufacturing a thin film transistor array substrate according to the present embodiment includes forming the interlayer insulating layer by heat-treating the patterned thermosetting insulating material layer 134" (S110) after the forming of the pixel electrode 160 (S109).

Figure 3J:
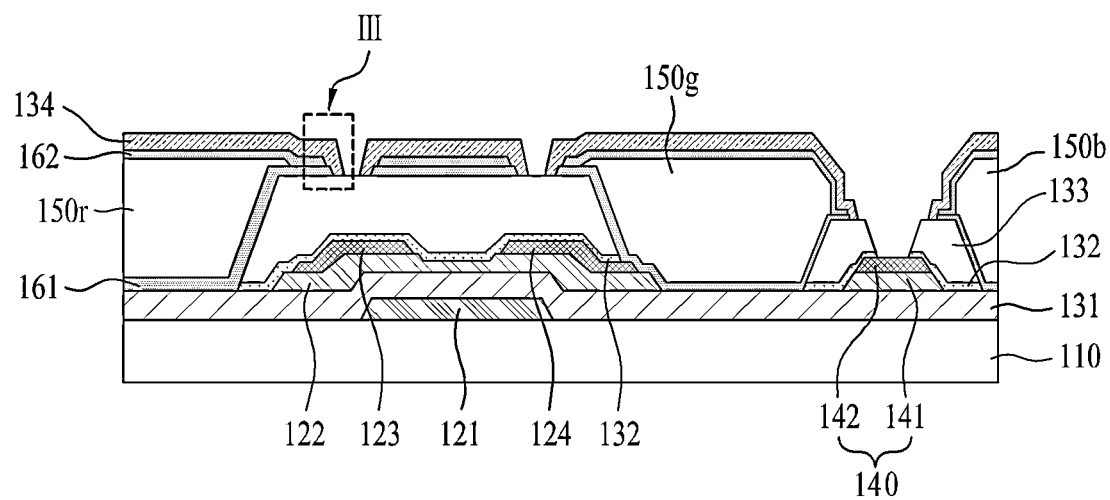

That is, as shown in FIGS. 3J, 5A, and 5B, when the patterned thermosetting insulating material layer 134" is heat-treated, the thermosetting insulating material of the patterned thermosetting insulating material layer 134" melts and becomes temporarily fluidic and an edge portion of the patterned thermosetting insulating material layer 134" flows down onto the second protective layer 133, thereby filling and removing the undercut region. Thus, the interlayer insulating layer 134 is formed to cover the side edge of the pixel electrode 160 and contact at least one portion of the second protective layer 133 (S110).

In this regard, since the side edge of the pixel electrode 160 is covered with the interlayer insulating layer 134, the pixel electrode 160 and a common electrode 170 that will be described later are isolated from each other by the interlayer insulating layer 134.

In addition, the side of the interlayer insulating layer 134 is continuously formed with the side of the protective layer 133 in a different manner from the patterned thermosetting insulating material layer 134" of FIG. 3I.

Figure 3K:
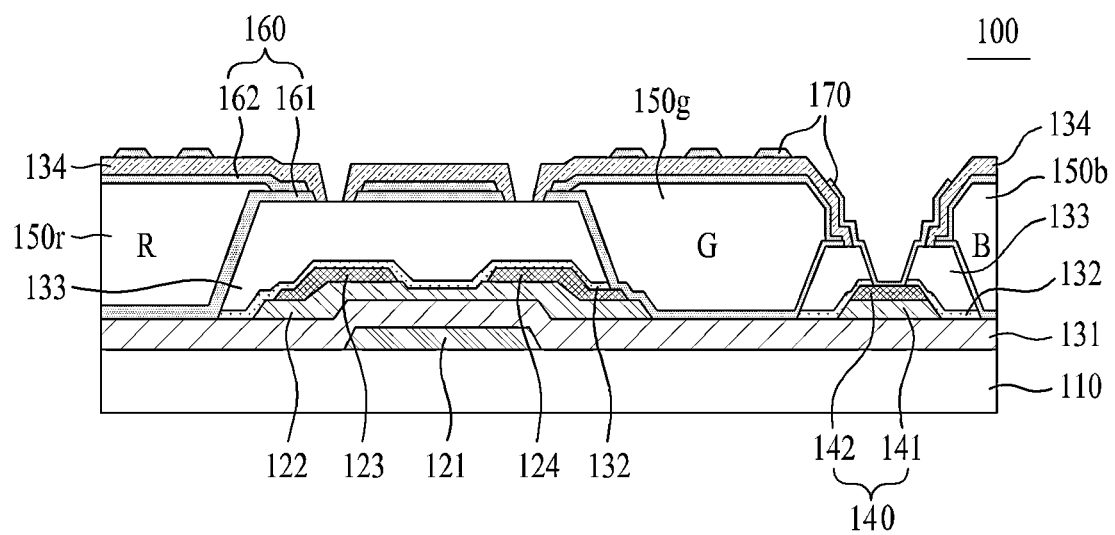

Referring to FIG. 3K, the common electrode 170 is formed on the interlayer insulating layer 134 to correspond to each pixel region (S111). The common electrode 170 is connected to the common line 140 and is located along the side of the interlayer insulating layer 134 such that the common electrode 170 covers the portion of the interlayer insulating layer 134 that now fills the undercut region. Thus, disconnection between the common electrode 170 and the common line 140 is prevented.

In this regard, the common electrode 170 may be formed of a transparent conductive material such as ITO.

As described above, according to the thin film transistor array substrate and the method of manufacturing the same according to the present invention, the interlayer insulating layer 134 is formed between the pixel electrode 160 and the common electrode 170 by patterning and heat-treating the thermosetting insulating material. Accordingly, short circuit between the pixel electrode 160 and the common electrode 170 and disconnection between the common electrode 170 and the common line 140 may be prevented. As a result, reliability of the thin film transistor array substrate may be improved.

As is apparent form the above description, since the interlayer insulating layer 134 is formed between the pixel electrode 160 and the common electrode 170 by heat-treating the patterned thermosetting insulating material 134" formed on the pixel electrode, the interlayer insulating layer 134 contacts at least one portion of the protective layer 133 to cover the side of the pixel electrode 160.

That is, during the wet etching process to form the pixel electrode 160, an undercut region is formed at a portion of the patterned thermosetting insulating material layer 134". However, the thermosetting insulating material 134" becomes temporarily fluidic by heat-treating the thermosetting insulating material 134" after the wet etching process, so that the interlayer insulating layer 134 from which the undercut region is removed may be formed.

Thus, disconnection between the common electrode 170 formed on the interlayer insulating layer 134 and the common line 140 caused by the undercut region may be prevented. In addition, since the side of the pixel electrode 160 is covered with the interlayer insulating layer 134, short circuit between the pixel electrode 160 and the common electrode 170 may be prevented.

Thus, the interlayer insulating layer 134 does not have an undercut region, thereby improving reliability of the thin film transistor array substrate.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing a substrate of a display device, the method comprising:
   forming a pixel electrode corresponding to a pixel of the display device, the pixel electrode having a side edge that is undercut under a patterned thermosetting insulating material layer; and
   forming, from the patterned thermosetting insulating material, an insulating layer that covers the side edge of the pixel electrode by heat-treatment of the patterned thermosetting insulating material, the patterned thermosetting insulating layer melting over the side edge of the pixel electrode during the heat treatment of the patterned thermosetting insulating material layer.

2. The method of claim 1, wherein:
   the pixel electrode has a plurality of side edges under the patterned thermosetting insulating material layer,
   the insulating layer covers the plurality of side edges of the pixel electrode, and
   the patterned thermosetting insulating layer melts over the plurality of side edges of the pixel electrode during the heat-treatment to enclose the pixel electrode at the side edges.

3. The method of claim 1, wherein the patterned thermosetting insulating material layer is comprised of negative photoacryl.

4. The method of claim 1, further comprising:
   forming a first pixel electrode layer; and
   forming a thermosetting insulating material layer over the first pixel electrode layer;
   patterning the thermosetting insulating material layer into the patterned thermosetting insulating material layer;
   wherein the pixel electrode is formed by patterning the first pixel electrode layer.

5. The method of claim 4, wherein a masking layer having a hole at an edge of a pixel region is disposed over the thermosetting insulating material layer during both the patterning of the thermosetting insulating material layer and the patterning of the first pixel electrode layer.

6. The method of claim 4, wherein forming the pixel electrode comprises patterning the first pixel electrode with wet etching, the wet etching producing an undercut region under an edge the patterned thermoset insulating material that is filled in as the patterned thermosetting insulating material melts over the side edge of the pixel electrode.

7. The method of claim 1, further comprising:
   forming a first pixel electrode layer;
   forming a color filter over the first pixel electrode layer; and
   forming a second pixel electrode layer over the color filter;
   wherein the pixel electrode is formed by patterning the first pixel electrode layer and the second pixel electrode layer.

8. The method of claim 7, further comprising:
forming a thin film transistor;
wherein the first pixel electrode layer is formed to connect the second pixel electrode layer and the thin film transistor.

9. The method of claim 1, further comprising:
forming a protective layer;
wherein the pixel electrode is formed over the protective layer, and
wherein the patterned thermosetting insulating layer melts over the side edge of the pixel electrode onto the protective layer during the heat treatment of the patterned thermosetting insulating material layer.

* * * * *